(12) United States Patent
Seo et al.

(10) Patent No.: US 7,863,702 B2
(45) Date of Patent: Jan. 4, 2011

(54) IMAGE SENSOR PACKAGE AND METHOD OF MANUFACTURING THE SAME

(75) Inventors: Byoung-Rim Seo, Seoul (KR); Jae-Cheon Do, Chungcheongnam-do (KR); Yung-Cheol Kong, Chungcheongnam-do (KR); Seok-Won Lee, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 1608 days.

(21) Appl. No.: 11/150,825

(22) Filed: Jun. 10, 2005

(65) Prior Publication Data

US 2006/0006486 A1 Jan. 12, 2006

(30) Foreign Application Priority Data

Jun. 10, 2004 (KR) .............. 10-2004-0042501
May 3, 2005 (KR) .............. 10-2005-0037018

(51) Int. Cl.
*H01L 29/78* (2006.01)
(52) U.S. Cl. .................. 257/432; 257/433
(58) Field of Classification Search .......... 257/432, 257/433, 434, 435
See application file for complete search history.

(56) References Cited

U.S. PATENT DOCUMENTS

| 5,624,512 A * | 4/1997 | Boszor ............ 156/87 |
| 5,673,083 A | 9/1997 | Izumi et al. |
| 6,122,114 A * | 9/2000 | Sudo et al. ........... 359/819 |
| 6,483,101 B1 | 11/2002 | Webster |
| 6,492,774 B1 | 12/2002 | Han et al. |
| 6,660,562 B2 | 12/2003 | Lee |
| 2003/0007084 A1 | 1/2003 | Nakjoh |
| 2003/0057359 A1 | 3/2003 | Webster |
| 2004/0038442 A1* | 2/2004 | Kinsman ............ 438/64 |
| 2004/0077121 A1* | 4/2004 | Maeda et al. ......... 438/75 |
| 2005/0247990 A1* | 11/2005 | Cheng ............ 257/432 |

FOREIGN PATENT DOCUMENTS

| CN | 1408176 | 4/2003 |
| KR | 2002-0071475 | 9/2002 |

OTHER PUBLICATIONS

English language abstract of the Korean Publication No. 2002-0071475.

* cited by examiner

*Primary Examiner*—Steven Loke
*Assistant Examiner*—Kimberly M Thomas
(74) *Attorney, Agent, or Firm*—Muir Patent Consulting, PLLC

(57) ABSTRACT

An image sensor package assembling method includes providing a substrate on which a plurality of image sensors are mounted; providing a housing strip having a plurality of housings arranged corresponding to an arrangement of the image sensors on the substrate, each of the housings having an aperture corresponding to an active surface of the corresponding image sensor and a cavity enclosing an edge of the corresponding image sensor; attaching a transparent cover plate sealing the apertures of the housings on the housing strip after attaching the housing strip on the substrate; and separating image sensor packages from each other by successively cutting the transparent cover, the housing strip and the substrate. Increased yield and production efficiency can be realized.

24 Claims, 15 Drawing Sheets

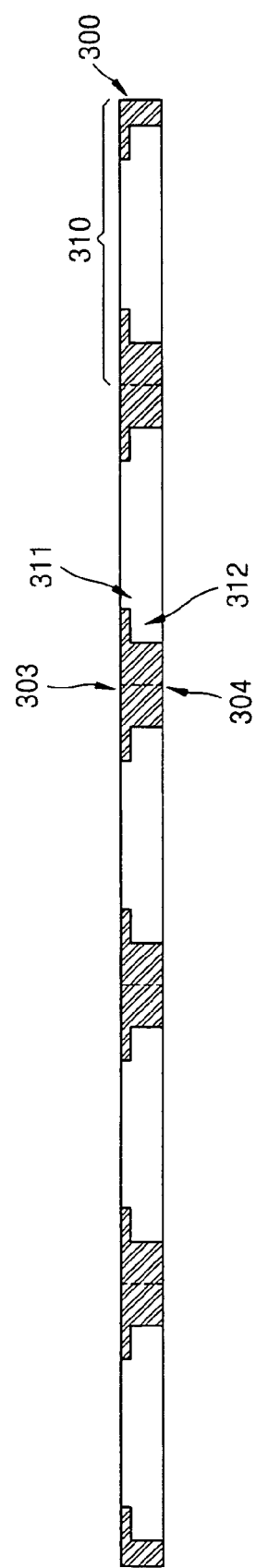

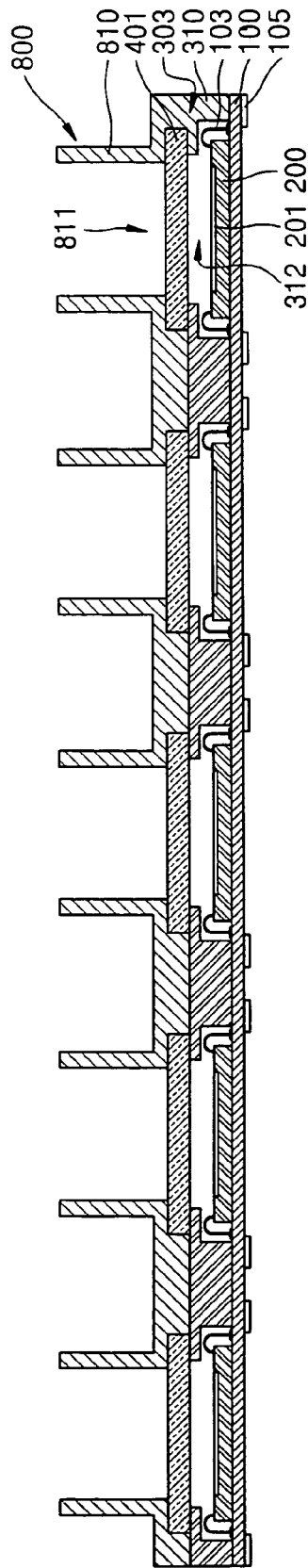
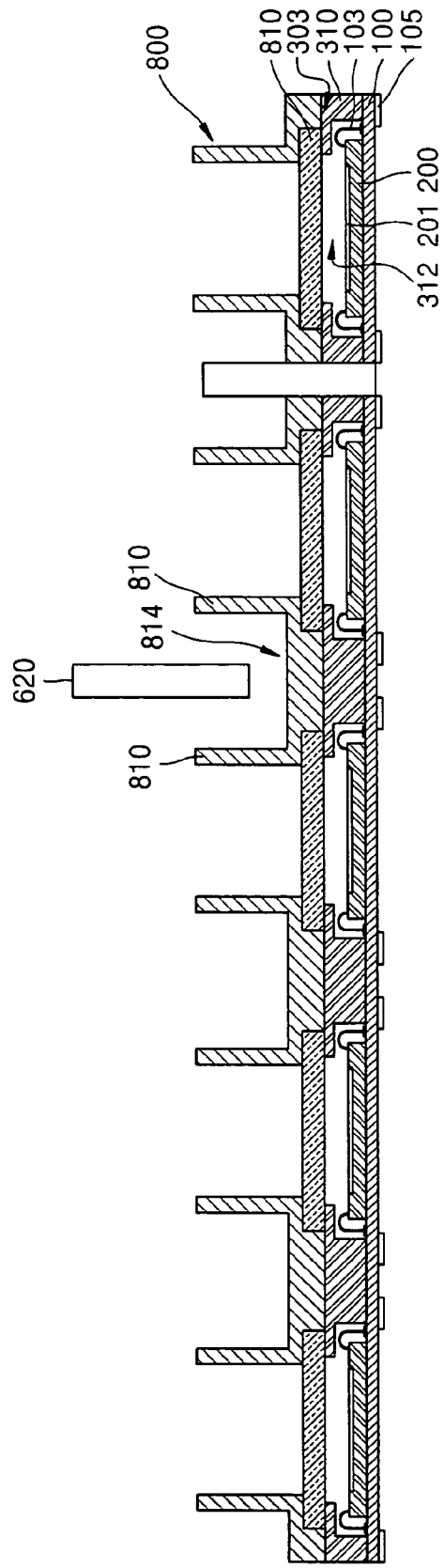

IMAGE SENSOR PACKAGE AND METHOD OF MANUFACTURING THE SAME

This application claims the priority of Korean Patent Application Nos. 2004-42501, filed on Jun. 10, 2004, and 2005-0037018, filed on May 3, 2005, in the Korean Intellectual Property Office, the disclosure of which are incorporated herein in their entirety by reference.

BACKGROUND OF THE INVENTION

1. Field of the Invention

The present invention relates to a package for an electronic component, and, more particularly, to an image sensor package and a method of manufacturing the same.

2. Description of the Related Art

An image sensor is a semiconductor device that converts optical information into an electrical signal. Image sensors are generally classified as charge coupled device (CCD) image sensors or complementary metal oxide semiconductor (CMOS) image sensors. An image sensor is packaged to protect the image sensor's optoelectronics and to permit light to impinge on a light reception or active surface of the image sensor.

A typical image sensor package accordingly includes a housing and a window through which the light is transmitted to the light reception active surface. The image sensor package might further include a lens supported by a lens holder in proper alignment with the active surface of the image sensor. In this case, the lens holder is fitted on an aperture formed on the housing.

An example of such an image sensor package having a lens and a lens holder is discussed in U.S. Pat. No. 6,492,774 B1 to Webster entitled "MOLDED IMAGE SENSOR PACKAGE HAVING LENS HOLDER", issued on Nov. 19, 2002. In the image sensor package disclosed therein, a screw thread is formed on an outer circumference of a circular lens holder and the housing is provided with a circular aperture in which the lens holder is inserted. A screw thread is also formed on an inner circumference of the aperture so that the lens holder can be thread-coupled within the aperture. This assembly process must be repeated for each image sensor package. Perhaps needless to say, such assembly is pains-taking, time-consuming and costly.

Undesirably, when the lens holder is threaded into the aperture of the housing, friction occurs between the mating screw threads. Because of this screw thread friction, the mating screw threads tend to abrade. The abrasion produces free particles within the housing's aperture. Such free particles obscure the optical path and produce uncompensable errors in the image sensing process. Furthermore, it is difficult precisely to control the threading of the lens holder into the aperture. As a result, the focus of the lens requires later adjustment in order to achieve optimal optical alignment and imaging performance.

Therefore, there is a need for an image sensor package that prevents undesirable free-particulate production during manufacture. There is also a need for a manufacturing method in which a plurality of image sensors can be simultaneously assembled into corresponding packages.

SUMMARY

The invention provides, among other things, a method of manufacturing plural image sensor packages while effectively preventing the generation of free particles that could contaminate the optical path and thus compromise image quality. The invention also provides an image sensor package manufactured by such a method.

In an image sensor package assembling method according to one embodiment of the present invention, a plurality of housings and/or a plurality of barrels are simultaneously assembled on corresponding image sensors regularly arranged on a substrate.

First, a plurality of image sensors are mounted on a substrate in a regular array. Then a strip of identically arrayed plural housings is mounted on the substrate. Each of the housings includes an opening, e.g., an aperture aligned with an active surface of a corresponding image sensor and a peripheral cap for engaging a peripheral edge of the image sensor.

Next, a transparent cover plate sealing the apertures is affixed over the substrate-mounted housing strip. Next, the resulting image sensor packages are separated from each other by successively cutting the transparent cover, the housing strip and the substrate.

A barrel is assembled on each of the separated image sensor packages and a lens assembly is inserted in each barrel. Each lens assembly includes one or more lenses and one or more spacers disposed between the lens and the cover plate and/or between the lenses. Alternatively, a barrel strip having a plurality of barrels connected to each other is attached to the housing strip and/or the cover plate before the image sensor packages are separated. The barrel strip is formed by injection molding, and the long axes of the barrels are vertically disposed on the transparent cover plate.

In one embodiment of the invention, the barrels include smooth, circular, inner surface that smoothly and simply accommodate the lens assemblies slid thereinto.

In another embodiment, an image sensor package assembling method comprises providing a substrate on which a plurality of image sensors are mounted; providing a housing strip including a plurality of housings arranged corresponding to an arrangement of the plurality of image sensors on the substrate, each of the plurality of housings including an aperture corresponding to an active surface of a corresponding one of the plurality of image sensors and a cavity for at least partly receiving therein a corresponding one of the plurality of image sensors; affixing the housing strip on the substrate; attaching a transparent cover plate to seal the apertures of the plurality of housings on the housing strip; and separating the plurality of image sensor packages from each other by cutting the transparent cover plate, the housing strip, and the substrate.

Preferably, the separating of the plurality of the image sensor packages comprises cutting the cover plate, thereby exposing a portion of the housing strip; and cutting the substrate and the exposed portion of the housing strip.

More preferably, the cutting of the cover plate and the cutting of the exposed portion of the housing strip and the substrate are processed such that a cutting surface of the cover plate can be located more inwardly than the exposed portion of the housing strip and a cutting surface of the substrate. Also, the cutting of the cover plate and the cutting of the exposed portion of the housing strip and the substrate are processed such that a cutting surface of the cover plate can be located on a plane identical to those of the exposed portion of the housing strip and a cutting surface of the substrate. In addition, the cutting of the cover plate may be processed such that a separated cover plate is sized to cover the aperture when the separated cover plate is disposed on the housing strip.

In yet another embodiment, an image sensor package assembling method comprises mounting a plurality of image sensors on a substrate; affixing to the substrate a housing strip having a plurality of housings arranged corresponding to an arrangement of the plurality of image sensors, each of the plurality of housings having an aperture corresponding to an active surface of a corresponding one of the plurality of image sensors and a cavity configured to at least partly receive therein the corresponding one of the plurality of image sensors; attaching a transparent cover plate to seal the apertures of the plurality of housings on the housing strip; separating the transparent cover plate into a plurality of windows that seal the apertures of the respective housings by cutting a first portion of the transparent cover plate using a first blade to expose a first portion of the housing strip; attaching to the exposed first portion of the housing strip a barrel strip including a plurality of barrels each connected to at least one other; and separating the plurality of image sensor packages from each other by cutting through a first portion of the barrel strip and the substrate, using a second blade having a narrower effective cutting width than that of the first blade.

Preferably, the cutting of the barrel strip is processed such that the housing strip and the substrate that are disposed under the barrel strip can be cut in a single process so that cutting surfaces of the barrel strip, the housing strip and the substrate can be located on an identical plane.

Preferably, a portion of the cover plate is cut away such that the separated transparent cover plate can cover the aperture when the separated transparent cover plate is disposed on the housing strip.

In still another embodiment, an image sensor package assembling method comprises providing a substrate on which a plurality of image sensors are mounted; attaching to the substrate a housing strip having a plurality of housings arranged corresponding to an arrangement of the plurality of image sensors on the substrate, each of the plurality of housings having an aperture corresponding to an active surface of a corresponding one of the plurality of image sensors and a cavity configured for at least partly receiving therein the corresponding one of the plurality of image sensors; attaching a transparent cover plate to seal the apertures of the plurality of housings on the housing strip; attaching on the transparent cover plate a barrel strip having a plurality of barrels connected to each other; and separating the plurality of image sensor packages from each other by performing a cutting process along intermediate expanses of the barrel strip.

Preferably, the image sensor package assembling method may further comprise cutting the cover plate before the barrel strip is attached on the transparent cover plate.

In another embodiment, an image sensor package assembling method comprises providing a substrate on which a plurality of image sensors are mounted; attaching to the substrate a housing strip having a plurality of housings arranged corresponding to an arrangement of the plurality of image sensors on the substrate, at least one of the plurality of housings having an aperture for enclosing a corresponding one of the plurality of image sensors; and affixing a separated individual transparent cover plate within the at least one of the apertures of the plurality of housings. The method may further comprise cutting the housing strip and the substrate to provide a plurality of individual image sensor packages. In addition, the method further comprises assembling on each individual image sensor package a barrel having an opening aligned with the aperture of a corresponding one of the plurality of housings. Finally, the method may further comprise inserting a lens assembly into the opening of each barrel.

BRIEF DESCRIPTION OF THE DRAWINGS

The above and other features and advantages of the present invention will become more apparent by describing in detail exemplary embodiments thereof with reference to the attached drawings.

FIGS. 2A and 2B respectively are sectional and isometric views of a housing strip for the image sensor package, in accordance with one embodiment of the invention.

FIG. 10 is a sectional view illustrating a process for mounting a barrel strip on a prepared image sensor package assembly, in accordance with one embodiment of the invention.

FIG. 11 is a sectional view illustrating a process for separating barrel-equipped image sensor packages, in accordance with one embodiment of the invention.

DETAILED DESCRIPTION

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

In one embodiment of the invention, an image sensor package includes an image sensor mounted on a substrate, a housing protecting the image sensor and being provided with an aperture, and a window installed over the aperture. An assembling method thereof also is disclosed. In another embodiment of the invention, an image sensor is provided with a barrel attached to the window and/or the housing. An assembling method thereof also is disclosed. A lens assembly slid into the barrel comprises one or more lenses and spacers adjusting and maintaining distances between a lens and an active surface of the image sensor and between the lenses themselves.

The housing, the window, and/or the barrel can be assembled so that a plurality of regularly arrayed image sensors are mounted and aligned on the substrate. The insertion process of the lens assembly into the respective barrels also can be performed so that the image sensors are mounted and aligned on the substrate. In other words, the packaging process or the component assembling process may be performed so that the image sensors are attached and aligned on the substrate.

In order to package a plurality of image sensors simultaneously, a housing strip in which a plurality of housings for the respective image sensors are connected to each other is provided. In addition, a separate window need not be provided for each image sensor. Instead, a single, large infrared (IR) filter glass window is attached on the housing strip to cover all of the image sensors regularly arrayed on the substrate. The glass window covered image sensors then can be individually cut after the assembling process is completed.

Furthermore, a barrel strip in which a plurality of barrels for the respective image sensors are connected to each other is attached on the windows and/or the housings and the barrels are individually separated from each other after the assembling process is completed. When the barrel strip is assembled and/or the barrels are individually separated from each other, the lens assembly having the one or more lenses and one or more spacers is inserted and attached in the window by the sliding motion.

Preferred embodiments of the present invention will be described hereinafter in conjunction with the accompanying drawings.

Figure 1A:
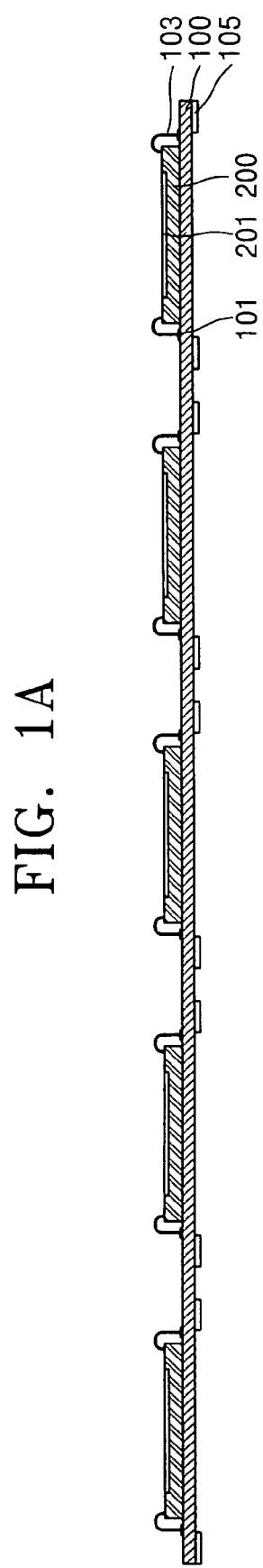
FIGS. 1A and 1B respectively are sectional and isometric views of a substrate on which a plurality of image sensor packages are regularly arrayed, in accordance with one embodiment of the invention.
Figure 1B:
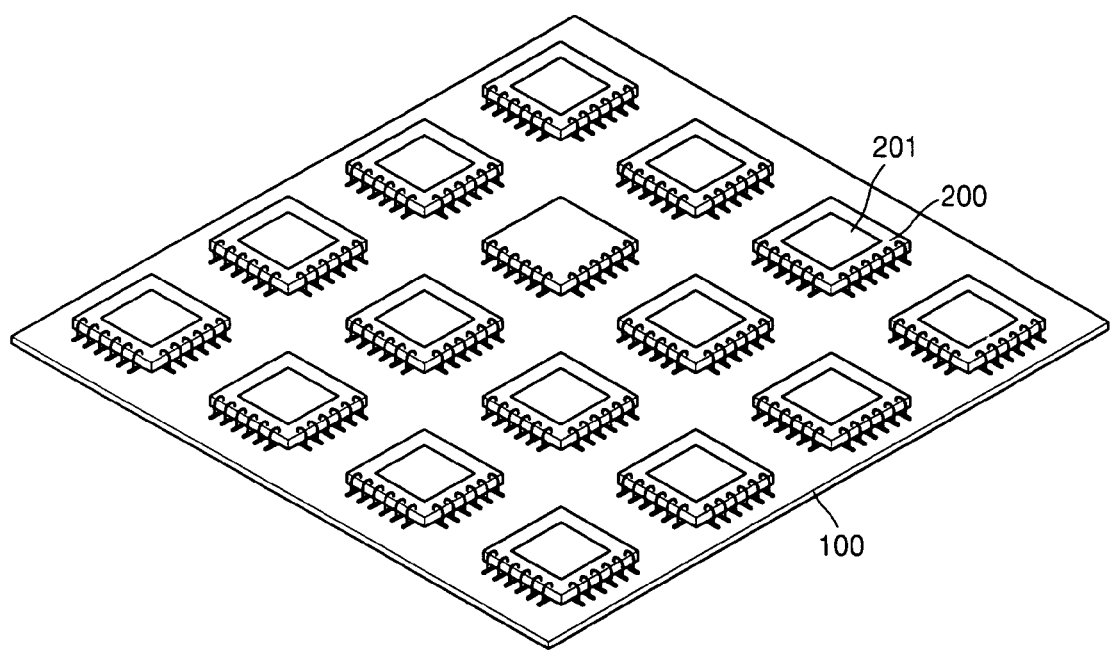

FIGS. 1A and 1B show a substrate on which a plurality of image sensor packages are regularly arrayed according to one embodiment of the present invention.

A plurality of image sensors 200 are arranged in a preferably regular orthogonal array on a substrate 100 such that active surfaces 201 thereof face upward. The image sensor 200 may be formed of a CCD image sensor or a CMOS image sensor in which a pyroelectric ceramic is applied to a CMOS device. The substrate 100 can be formed of a chip carrier substrate such as a printed circuit board (PCB), an aluminum-based ceramic board, a plastic glass laminated substrate, a tape-based substrate, or a flexible PCB (FPCB). A coupling terminal 105 to which a FPCB or a socket is electrically coupled can be provided on a rear surface of the substrate 100.

In order to attach the plurality of image sensors 200 on the substrate 100, an adhesive layer (not shown) is disposed between the substrate 100 and each of the image sensors 200. The image sensors 200 are electrically connected to the substrate 100 by bonding wires 103 bonded on interconnection pads 101. However, the present invention is not limited to this embodiment but may be varied, within the spirit and scope of the invention, by the use of any suitable bonding technique such as a flip chip technique. When the images sensors 200 are aligned and attached on the substrate 100 but before the substrate 100 is cut into a plurality of segments for the respective images sensors 200, subsequent package assembling processes are performed, such as a housing assembling process, a window assembling process, a barrel assembling process, a lens assembling process, and the like.

Figure 2B:
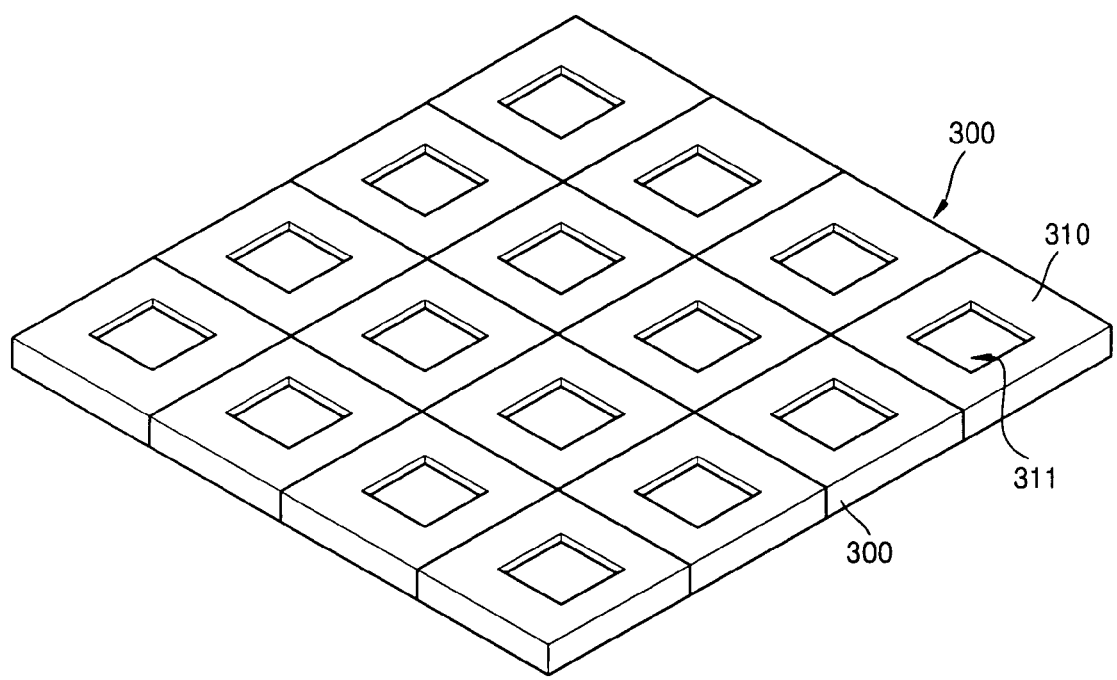

FIGS. 2A and 2B show a housing strip for an image sensor package according to one embodiment of the present invention.

In order to assemble the housings 310 that protect the respective image sensors 200, a housing strip 300 is used, on which the housings for the respective image sensors 200 are connected to each other. By mounting the housing strip 300 (including the housings 310 connected to each other) on the substrate 100, the plurality of housings 310 are simultaneously assembled around the image sensors 200 on the substrate 100. Such a housing strip 300 with the housings 310 connected to each other may be formed by an injection molding process. Accordingly, the housing strip 300 is formed such that it can be attached on portions of the substrate 100 that are defined between the image sensors 200, while allowing the housings 310 to enclose the respective image sensors 200. It may be seen from FIGS. 2A and 2B that each housing 310 has an aperture 311 corresponding to an active surface 201 of the corresponding image sensor 200.

Preferably, the housing 310 is configured in a rim-shape, or as a circumferential cap, that engages or captures an edge of the image sensor 200, as will be seen. The housing strip 300 is formed by connecting the rims to each other. A gap is formed between the housing 310 and the image sensor 200, thereby defining a recess or cavity 312 that accommodates the image sensor 200. In other words, the image sensor package of the embodiment is substantially formed in an air-cavity type package. An interior height of the housing 310 is designed to be greater that that of the image sensor 200 so that a loop height of the bonding wire 103 is slightly less than the height of the housing 310 if a wire bonding technique is used for electrically connecting the image sensors 200 to the substrate 100. The housing strip 300 may be formed of plastic or ceramic material that is appropriate for the injection molding process.

As shown in FIG. 2B, since the housing strip 300 is formed in a simple structure connecting the housings 310 each having the cavity 312 and the aperture 311, it is easy to form the housing strip 300 by the injection molding process.

Figure 3:
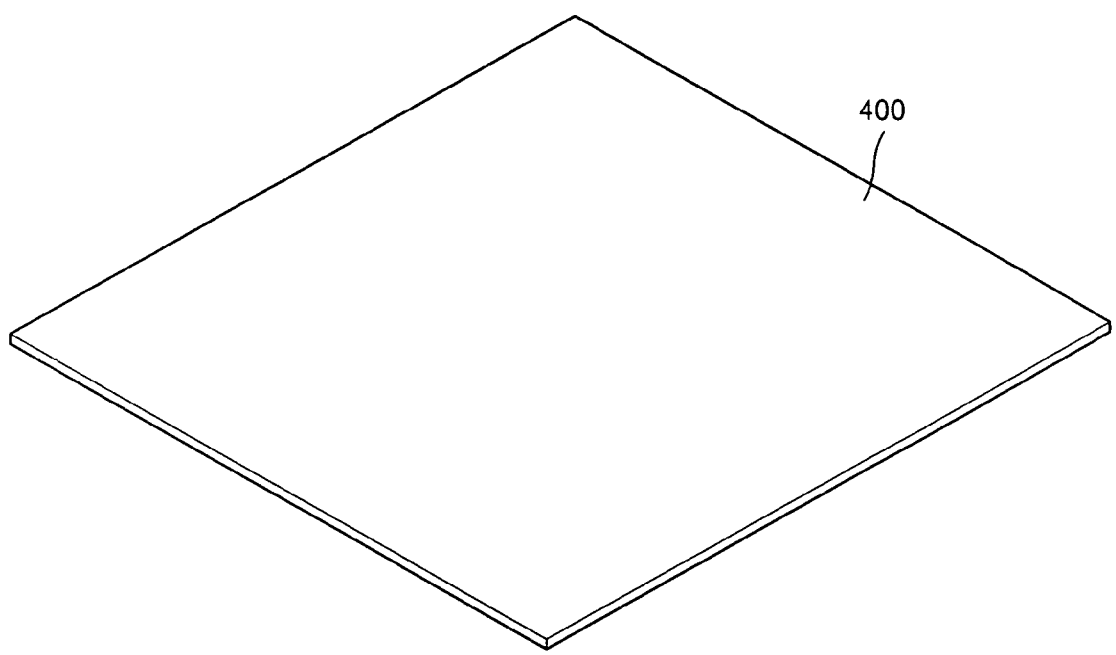
FIG. 3 is an isometric view of a cover plate of the image sensor package, in accordance with one embodiment of the invention.

FIG. 3 shows a cover plate for a window of an image sensor package according to one embodiment of the present invention.

A window is provided to seal the aperture 311, thereby protecting the image sensor 200 disposed in the housing 310 while allowing light to be incident through the aperture 311 on the active surface of the image sensor 200. In this embodiment, a cover plate 400 is provided for the window. The cover plate 400 is mounted on the housing strip 300. In other words, for this embodiment, the windows are not individually assembled on the respective image sensors, but instead the large-sized cover plate 400 is assembled on the housing strip 300 to simultaneously seal all the apertures 311 of the respective housings 310.

In the image sensor package technology, the window is generally formed of a glass substrate functioning as an IR filter. Therefore, the cover plate 400 may be formed of an IR filtering glass substrate dimensioned to cover substantially all of the substrate 100 depicted in FIG. 1A.

As described above, the housing strip 300 is aligned and mounted on the substrate 100 such that the housings 310 can be aligned with the respective image sensors 200 arranged on the substrate 100. The cover plate 400 is attached on the housing strip 300 to seal all of the apertures 311 of the respective housings 310. That is, a top surface 303 (refer to FIG. 2A) of the housing strip 300 contacts the cover plate 400 and a bottom surface 304 of the housing strip 300 contacts the substrate 100. This can be best understood by reference to FIGS. 4A and 4B.

Figure 4A:
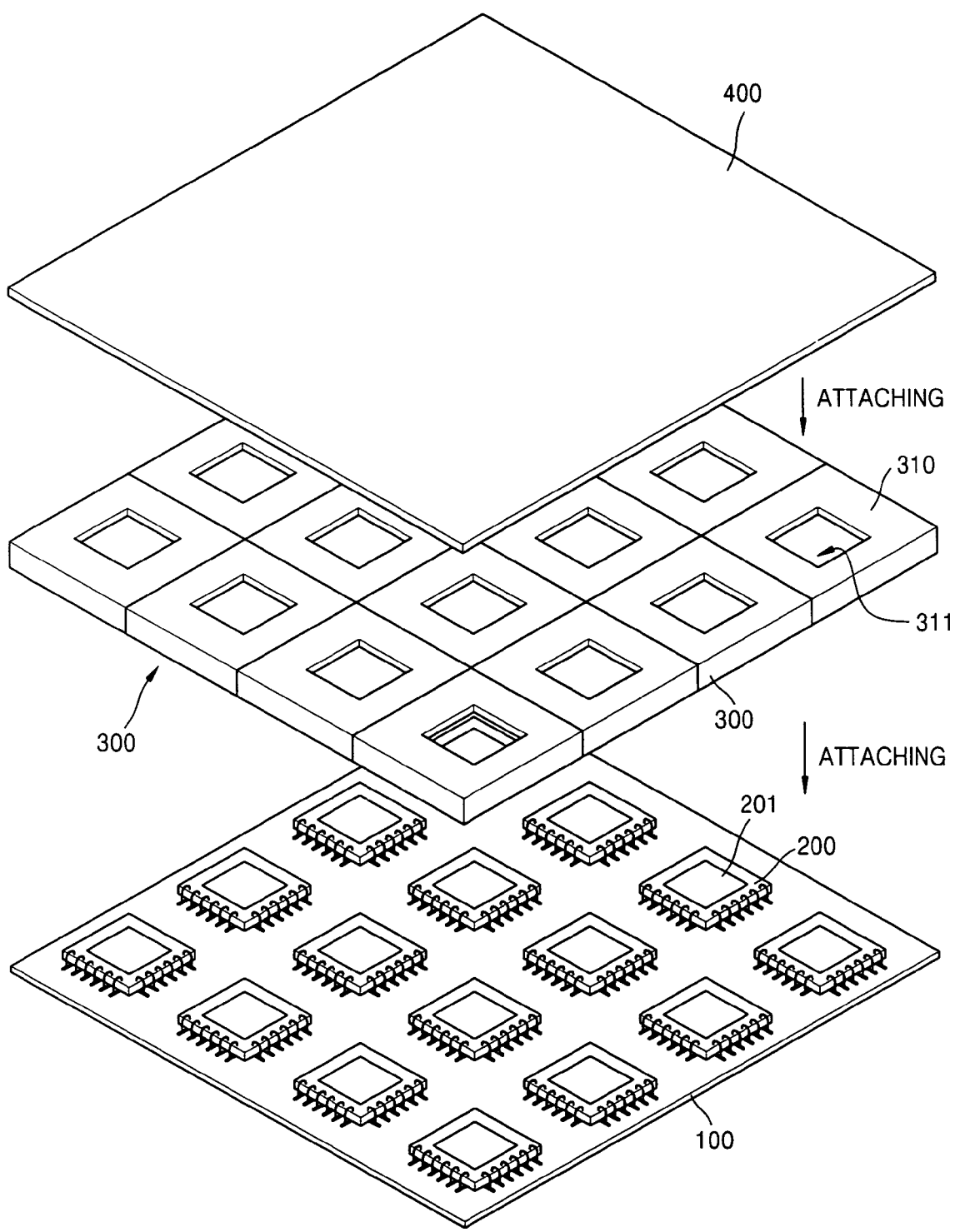
FIGS. 4A and 4B respectively are isometric and sectional views of a process for assembling a housing strip and a cover plate on a substrate mounting a plurality of image sensors, in accordance with one embodiment of the invention.
Figure 4B:
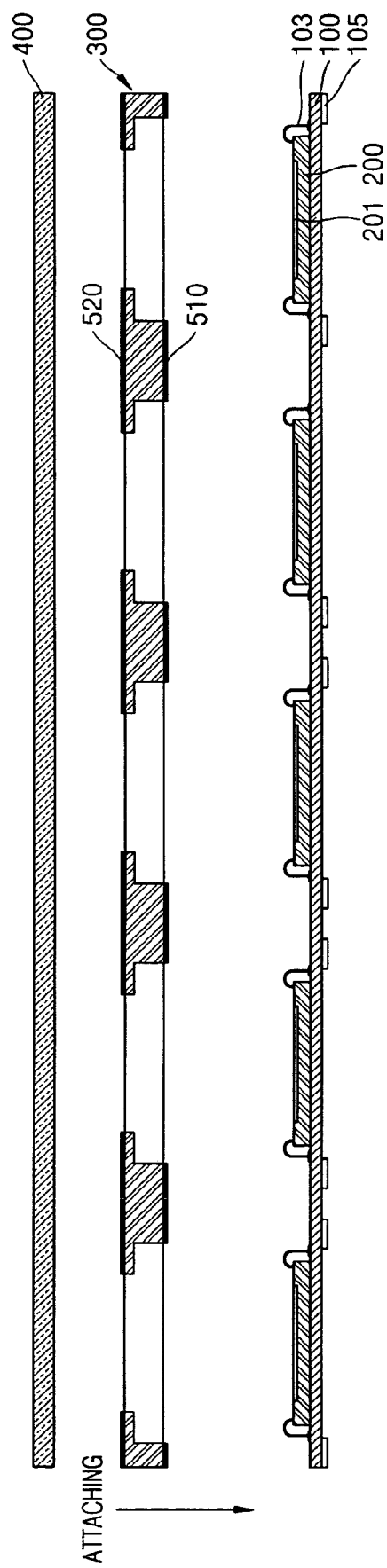

FIGS. 4A and 4B illustrate a process for assembling a housing strip and a cover plate on a substrate on which a plurality of image sensors are arranged according to one embodiment of the present invention.

The substrate 100, the housing strip 300 and the cover plate 400 are affixed to each other by any suitable means, e.g. adhesive. For example, as shown in FIG. 4B, a first adhesive layer 510 is applied onto the bottom surface 304 (Refer to FIG. 2A) of the housing strip 300 and is then affixed to the substrate 100. Since the bottom surface 304 corresponds to exposed portions of the substrate 100 defined between the image sensors 200, the first adhesive layer 510 formed on the bottom surface 304 is affixed to the exposed portions of the substrate 100 to provide a seal.

The first adhesive layer 510 may be formed of an epoxy resin. Preferably, the epoxy resin is in a B-stage that is a gel rather than an A-stage that is a liquid. Generally, it is well known that the epoxy resin is transformed from the A-stage to the B-stage by an appropriate temperature curing process. Similarly, the epoxy resin is further transformed from the B-stage to a C-stage that is a solid by an appropriate temperature curing process.

By forming the first adhesive layer 510 using the B-stage epoxy resin, it becomes easier to handle the housing strip 300. This is in contrast to a case where the A-stage epoxy resin is used. When the housing strip 300 is attached on the substrate 100 by the first adhesive layer 510 formed of the semi-solid epoxy resin, the temperature curing process is performed for the first adhesive layer 510, thereby solidifying the first adhesive layer 510 and tightly attaching the housing strip 300 onto the substrate 100.

A second adhesive layer 520 (refer to FIG. 4B) is applied to the top surface of the housing strip 300 and the cover plate 400 is affixed to the second adhesive layer 520. The second adhesive layer 520 is also formed of the B-stage epoxy resin. After the cover plate 400 is affixed to the second adhesive layer 520, the temperature curing process is performed to solidify the second adhesive layer 520. Those of skill in the art will appreciate that, alternatively to two different temperature curing processes, the temperature curing process may be performed one time only, after both the substrate 100 and the cover plate 400 are affixed to the first and second adhesive layers 510 and 520, respectively.

At this point, the temperature curing process may include a vacuum pumping process and a thermal pressing process. If air or gas is present within a cavity 312, then the image sensor package may crack due to the expansion of the air or gas during the thermal pressing process. In order to prevent this, a pumping process is performed to exhaust the air or gas out of the cavities of the housings 310 before the thermal pressing process is performed. As described above, the image sensors 200 are fully enclosed by the assembly of the substrate 100, the housing strip 300 and the cover plate 400.

Figure 5A:
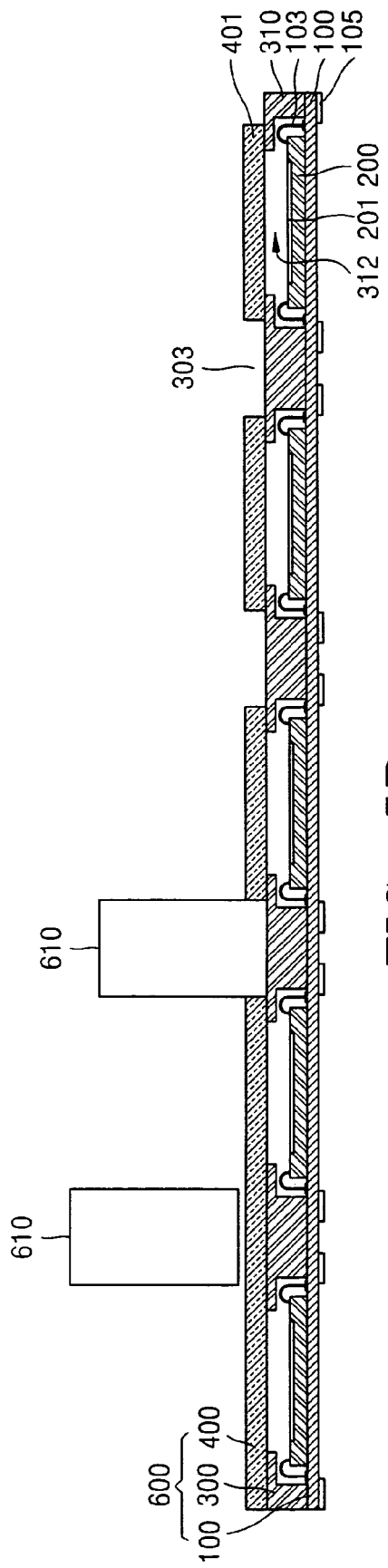
FIGS. 5A and 5B are sectional views illustrating a two-step process for separating image sensor packages from each other, in accordance with one embodiment of the invention.
Figure 5B:
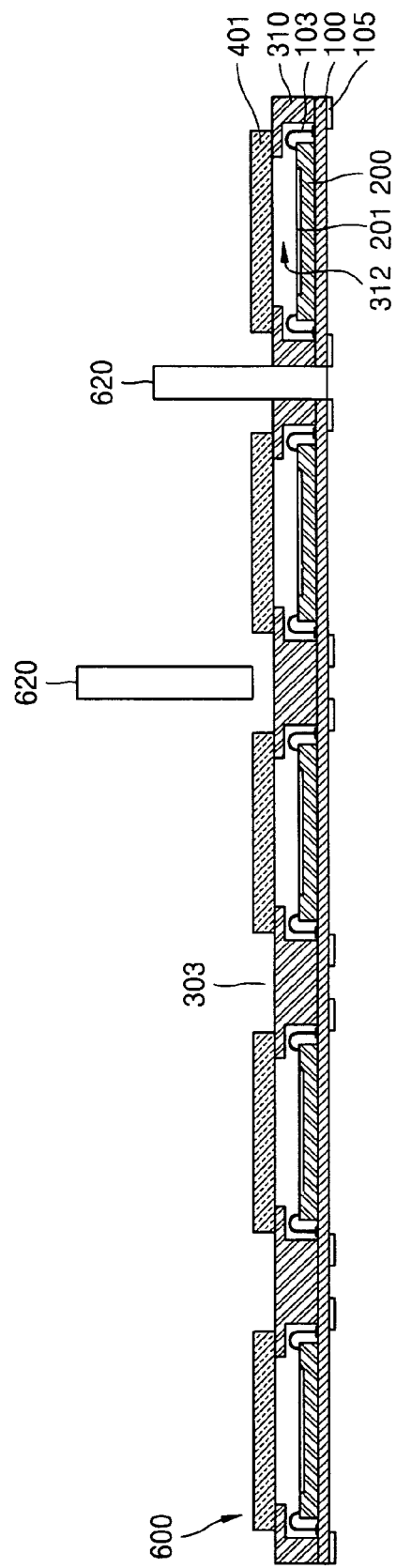

FIGS. 5A and 5B illustrate a two-step process for separating image sensor packages from each other according to an embodiment of the present invention.

Those of skill in the art will appreciate that the image sensor package assembly 600 of the substrate, the housing strip, and the cover plate is complete. To deploy individual image sensor packages in a useful way, however, it next is cut, sawn, scored-and-snapped or routed to dispense individual image sensor packages. The cutting process may be a step cutting process in which a plurality of cutting processes are preformed or a single cutting process in which only a single cutting process is performed, as is known.

For example, as shown in FIG. 5A, the cover plate 400 may be cut using a first blade 610 such that the windows 401 can be separated from each other. The first blade 610 eliminates portions of the cover plate 400, which are defined between the windows 401, such that a gap between the windows 401 can be relatively wide. As a result, portions of the housing strip 300 attached on the cover plate 400 are exposed, as illustrated.

As shown in FIG. 5B, a middle portion of each of the exposed portions of the housing strip 300 are cut next, using a second blade 620 to separate the housings 310 from each other. The gaps between the windows 401, which are formed by the first cutting process using the first blade 610, are wider than the gaps formed by the second blade 620 so that portions of the top surface of the separated housings 310 are exposed. That is, the cutting width of the first blade 610 is greater than that of the second blade 620 so that a step can be formed between the window 401 and the housing 310 supporting the window 401. The step may be used as an alignment key if a barrel and/or a lens assembly is mounted on the window 401. This lens assembly and barrel feature will be described in more detail below.

As described above, by the cutting process described above or another suitable individuation process, the image sensor packages on the assembly 600 are individually separated from each other. In addition, since the cutting process is performed for the entire substrate 100 to produce plural separate image sensor packages, processing efficiency is improved, thereby reducing costs.

According to this embodiment, the cutting of the cover plate 400 and the cutting of the exposed portion of the housing strip 300 and the substrate 100 are processed such that a cutting surface of the cover plate 400 can be located more inwardly than the exposed portion of the housing strip 300 and a cutting surface of the substrate 100. In addition, the cutting of the cover plate 400 may be processed such that a separated cover plate or window 401 can cover the aperture 311 when the separated cover plate 401 is disposed on the housing strip 300. The separated cover plate 401 may be smaller than the separated housing 310 but bigger than the aperture 311.

Figure 6A:
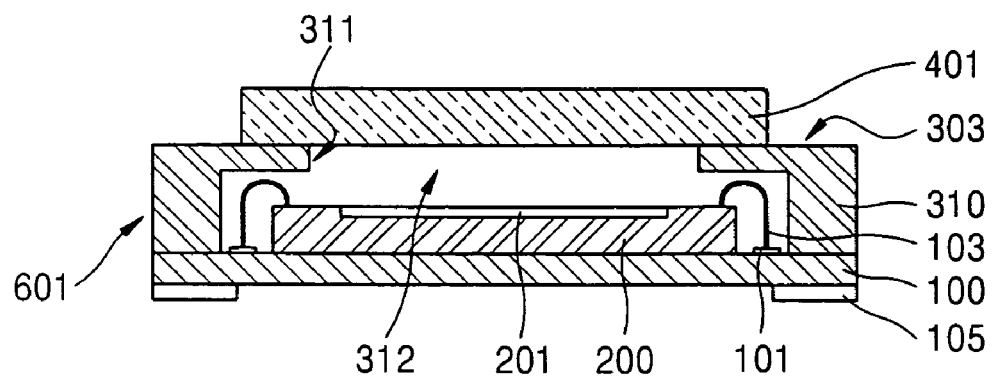
FIGS. 6A and 6B are sectional views of alternative embodiments of an assembled image sensor package, in accordance with the invention.
Figure 6B:
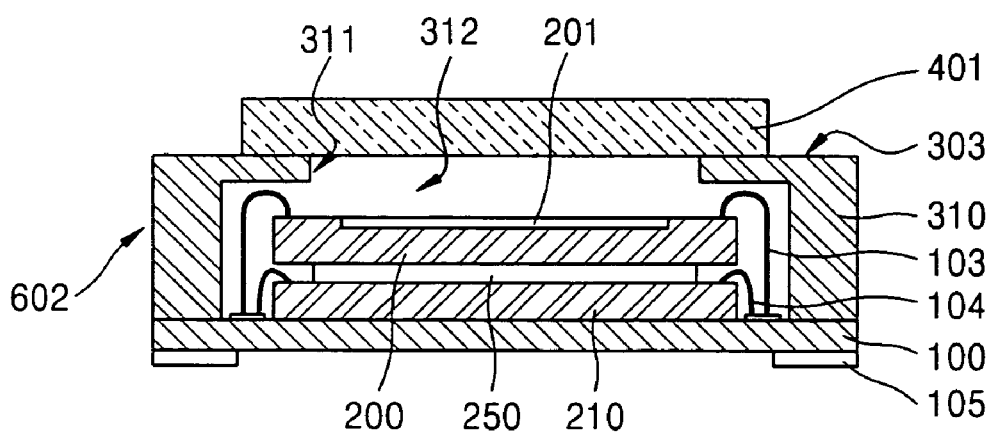

FIGS. 6A and 6B show an assembled image sensor package according to an embodiment of the present invention.

An image sensor package separated from the assembly 600 comprises the substrate 100 functioning as the chip carrier, the image sensor 200 disposed on the substrate 100, the housing 310 disposed on the substrate 100 to engagingly capture the peripheral edges of the image sensor 200, and the window 401 sealing the aperture 311 of the housing 310.

The image sensor package assembling method described with reference to FIGS. 1A through 5B can readily and simply be applied to a double chip package depicted in FIG. 6B as well as the single chip package depicted in FIG. 6A.

As shown in FIG. 6B, the double chip package differs from the single chip package in that two chips 200 and 210 are stacked atop one another.

As an example, a digital signal processor 210 is mounted on the substrate 100 and a bonding wire 104 is formed. The image sensor 200 is stacked on the digital signal processor 210 using a chip adhesive layer 250. Then, the housing strip 300 and the cover plate 400 are assembled as described and illustrated above and the various layers are cut and dispensed to provide the separated, double-chip image sensor package depicted in FIG. 6B.

Those of skill in the art will appreciate that the image sensor package 601 or 602 may be electrically connected to a PCB or FPCB by a coupling terminal 105. Applications for the invented image sensor package include a variety of imaging applications such as a bar code reader, a scanner, a camera, etc. Importantly, the invented image sensor package is of higher quality and lower cost than conventional image sensor packages.

The above-described image sensor package assembling method can be also used for manufacturing an image sensor package in which a lens assembly is aligned on an IR filter window.

Figure 7A:
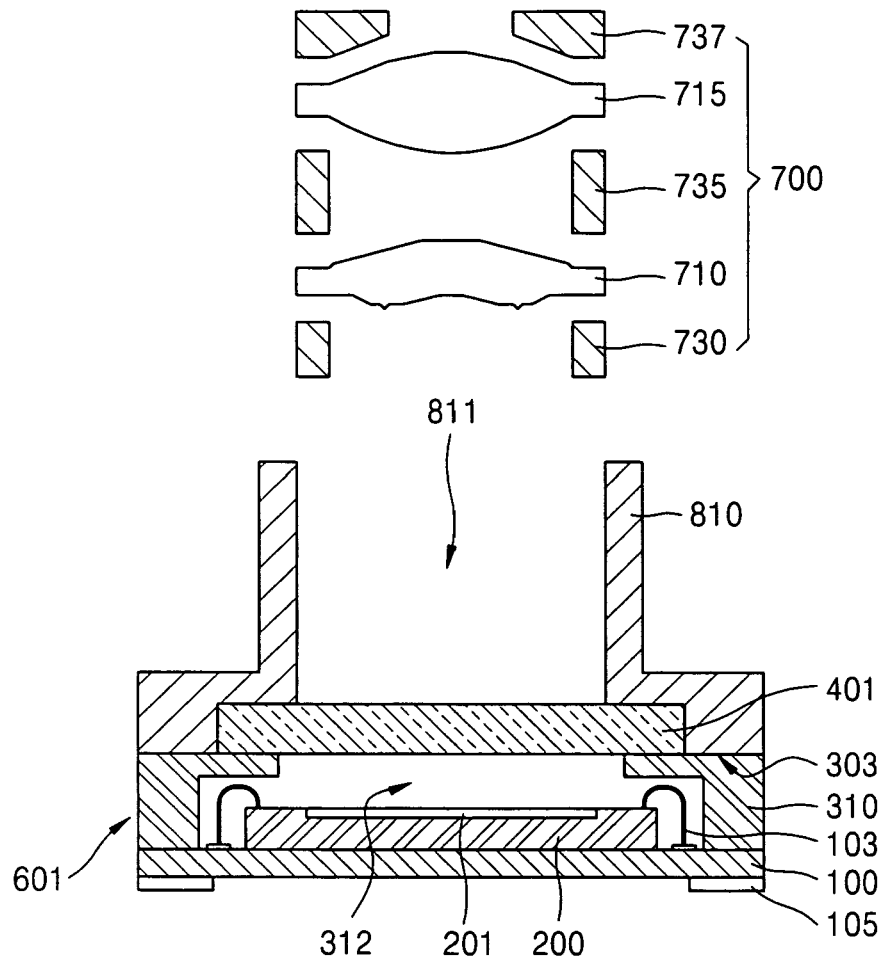
FIGS. 7A and 7B are sectional views illustrating a two-step process for assembling a lens assembly onto a separated image sensor package, in accordance with one embodiment of the invention.
Figure 7B:
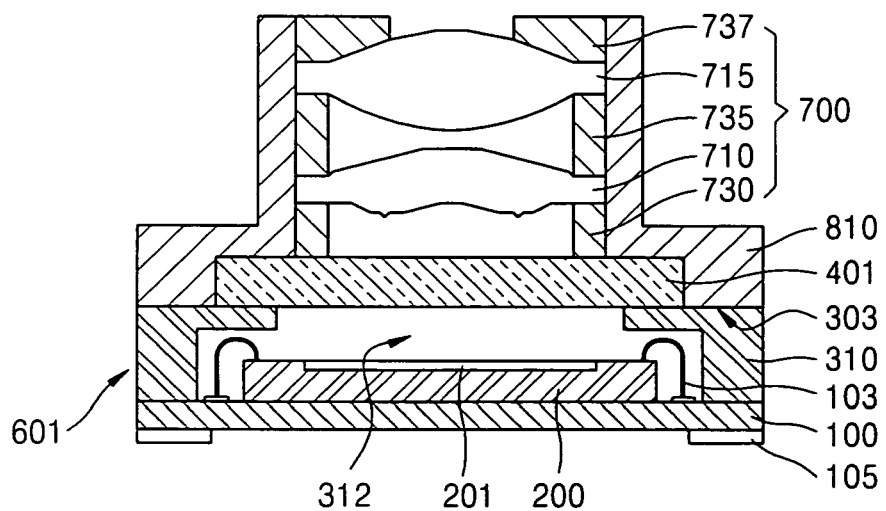

FIGS. 7A and 7B illustrate a two-step process for assembling a lens assembly on a separated image sensor package according to one embodiment of the invention.

Referring collectively to FIGS. 6A, 7A and 7B, a barrel 810 is mounted on the image sensor package 601 depicted in FIG. 6A. The barrel 810 is affixed to the exposed top surface 303 of the housing 310 by an adhesive layer (not shown). Alternatively or additionally, the barrel 810 may be affixed to the window 401 by the adhesive layer. The adhesive layer may be formed of a suitable adhesive material such as an epoxy-based material that can be hardened by light such as ultraviolet (UV) light. As in the package of FIGS. 5A and 5B, the package depicted in FIG. 6A may be also provided with a step formed between the top surface 303 of the housing 310 and the window 401. The step may be used as an alignment key when the barrel 810 is aligned on the window 401.

The barrel 810 is provided with an aperture 811 aligned with the active surface 201 of the corresponding image sensor 200. The barrel 810 may be formed of plastic by an injection molding process. Thus, although the barrel 810 is assembled on the image sensor package 601, as suggested by FIGS. 7A and 7B, plural regularly arrayed barrels such as barrel 810 can be formed alternatively in a strip part and assembled on the housing strip 300.

Next, the lens assembly 700 is assembled within the aperture 811 of the barrel 810. The lens assembly 700 comprises one or more lenses 710 and 715 and one or more spacers 730 and 735 disposed between the lenses 710 and 715 and/or between the lens 710 and the window 401. In other words, the first lens 710 is aligned on the first spacer 730, the second spacer 735 is aligned on the first lens 710, and the second lens 715 is aligned on the second spacer 735. A lens inlet member 737 is aligned on the second lens 715.

Such a lens assembly 700 is smoothly, slidably inserted into the aperture 811 of the barrel 810. All of the elements constituting the lens assembly 700 are dimensioned with an outer diameter that is formed fit to the inner diameter of the aperture 811 of the barrel 810. Since the barrel 810 has a smooth inner circumferential wall, the lens assembly 700 can smoothly slide into the barrel 810. The insertion of the lens part 700 into the aperture 811 of the barrel 810 can be realized by a vacuum absorption device. Because there are no threads or interference fit or torquing or other friction generated during the insertion of the invented lens assembly into the aperture of the invented barrel, the insertion process can be performed without producing any free particles or other optically obscuring contaminants that plague prior art image sensors.

The components of the lens assembly 700 can be inserted into the barrel 810 one by one. Alternatively, the lens assembly 700 can be pre-assembled with its components affixed to each other by an adhesive, and then the entire integral assembly can be inserted into the barrel 810 at once.

The spacers 730 and 735 function to maintain gaps between the active surface 201 and the lenses 710 and 715 in response to a preset focal length. In other words, the thickness of the first spacer 730 is set to maintain a first predetermined gap between the first lens 710 and the active surface 201. The first predetermined gap is set, as is known, with reference to a desired focal length.

Since the inner circumferential wall of the barrel 810 is formed to be smooth, the relative positions between the spacers 730 and 735 and the lenses 710 and 715 can be uniformly maintained in the barrel 810.

When the height of the housing 310, the height of the active surface 201 of the image sensor 200 and the thickness of the window 401 are fixed, the focal length depends substantially only on the thickness of the first spacer 730. Therefore, a back focal length (i.e., a length between the window 401 and the active surface 201) is fixed and the focus is simply and straightforwardly adjusted by the thickness of the first spacer 730. When the thickness of the first spacer 730 is uniformly maintained in light of a given, desired focal length, because the first spacer 730 is aligned on the window 401, the height of the first lens 710 above the active surface 201 can be uniformly maintained.

As a result, even when the barrel 810 and the lens assembly 700 are assembled on the image sensor package 601, the distances between the active surface 201 and the lenses 710 and 715 can be uniformly maintained to realize a desired focal length. This means that any additional focus adjusting process required of prior art image sensors can be omitted in the course of the assembling process, thereby further simplifying the assembling process.

The lens inlet member 737 preferably formed of ink carbon black or metal is provided to prevent the lens assembly 700 inserted into the barrel 810 from moving. In order to achieve this, after the lens part 700 is inserted in the barrel 810, the lens inlet member 737 preferably bonded to the barrel 810 by an adhesive. As the barrel 810 is formed in a right circular cylindrical-shape, the lens inlet member 737 may be formed in a ring-shape corresponding to the cylindrical barrel 810. Thus, the lens inlet member 737 also functions as a shielding layer to prevent light incident through an edge of the second lens 715. Those of skill in the art will appreciate that the lens inlet member 737 functions effectively as a fixed-opening iris of a camera.

By inserting the lens assembly 700 into the barrel 810 and affixing the lens assembly 700 on the barrel 810 using the adhesive, an image sensor package 601 depicted in FIG. 7B is realized.

As described above, the barrel 810 may be individually assembled on the separated image sensor package 601 as shown in FIG. 7A. Alternatively, a barrel strip on which a plurality of barrels 810 are connected can be assembled on the cover plate 400 such that the barrels 810 can be attached on the windows 401 and/or the housings 310. In this case, the barrel strip formed by the injection molding process should be prepared in advance.

Figure 8:
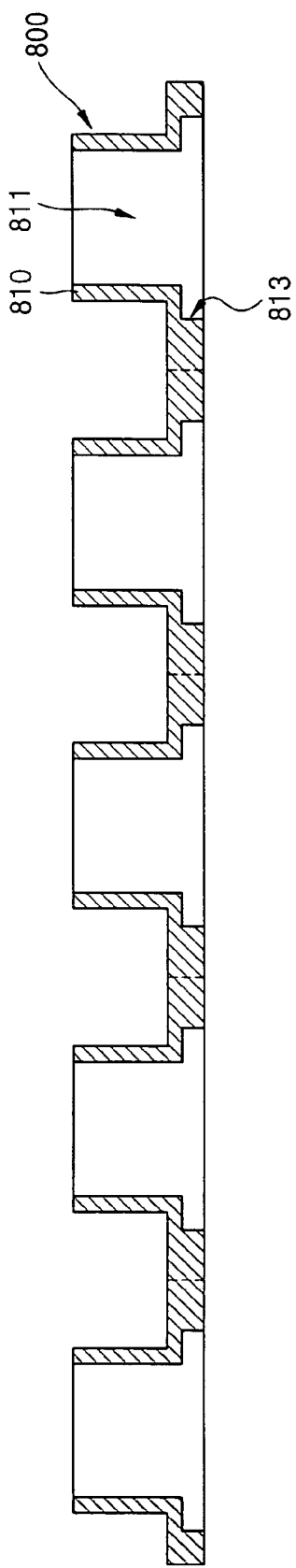
FIG. 8 is a sectional view illustrating a barrel strip for an image sensor package, in accordance with one embodiment of the invention.

FIG. 8 illustrates a barrel strip for an image sensor package according to one embodiment of the invention.

A barrel strip 800 includes plural regularly orthogonally arrayed barrels 810 of FIG. 7A connected to each other. Such a barrel strip 800 may be manufactured by an injection molding process. The barrel strip 800 preferably is formed of a plastic material such as polycarbonate and polyphenylsulfide appropriate for the injection molding process, as is known. The barrel strip 800 is formed such that the apertures 811 of the barrels 810 are aligned on the apertures 311 of the housings 310 of the housing strip 300 depicted in FIG. 2A. Also, as shown in FIG. 7B, the barrel 810 is provided at a lower end with a recess in which the window 401 having a width slightly less that that of the housing 310 is fitted.

Figure 9:
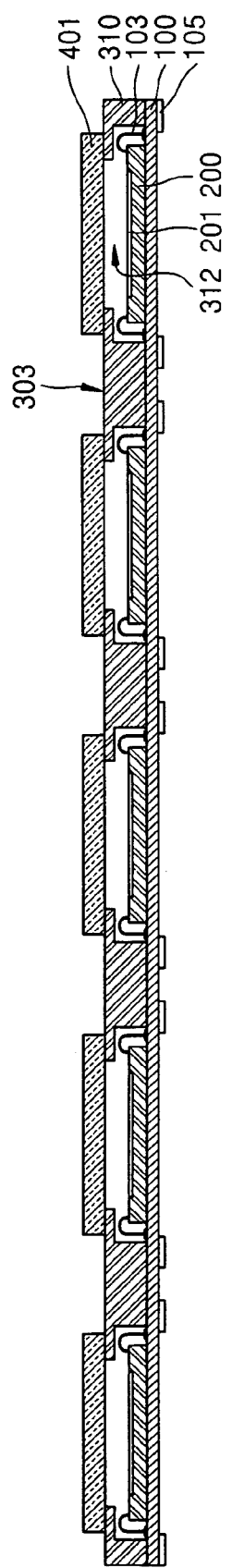
FIG. 9 is a sectional view illustrating a process for preparing an image sensor package assembly for mounting a barrel strip thereon, in accordance with one embodiment of the invention.

FIG. 9 illustrates a process for preparing an image sensor package assembly on which a barrel strip will be assembled according to an embodiment of the present invention.

The assembly 600 (refer to FIGS. 5A and 5B) of the substrate 100 on which the image sensors 200 are arranged, the housing strip 300 and the cover plate 400 are first prepared. Then, the cover plate 400 is cut into a plurality of segments corresponding to the respective image sensors 200. For example, portions of the cover plate 400, which are defined between the image sensors 200, are eliminated by a sawing or other suitable process using the first blade 610, thereby exposing portions of the upper surface 303 of the housing strip 300.

The step between the exposed upper surface 303 of the housing strip 300 and the separated windows 401 functions as an alignment key for aligning the barrel 810 on the active surface 201 of the image sensor 200. In other words, the barrel strip 800 is aligned on the assembly 600 on which the windows 401 have been spaced apart.

FIG. 10 shows a process for assembling a barrel strip on an image sensor package assembly according to an embodiment of the present invention.

A bottom surface of the barrel strip 800 is aligned and attached on the exposed upper surface 303 of the housing strip 300 on which the windows 401 are separated. At this point, an adhesive layer formed of, for example, thermosetting resin or epoxy resin that can be hardened by ultraviolet is used to attach the barrel strip 800 on the housing strip 300.

FIG. 11 shows a process for separating image sensor packages, according to an embodiment of the present invention, wherein the image sensor packages each is equipped with a barrel from a barrel strip.

Portions of the barrel strip 800, which are defined between the barrels 810, are cut by a second blade 620, in the course of which the substrate 100 is also cut into a plurality of segments, thereby separating the barrel-equipped image sensor packages from each other.

On the other hand, according to one aspect of the invention, the cutting of the barrel strip 800 can be processed such that the housing strip 300 and the substrate 100 that are disposed under the barrel strip 800 can be cut in a single cutting process so that cutting surfaces of the barrel strip 800, the housing strip 300 and the substrate 100 can be located on an identical plane, although not shown. Similarly, the cutting of the cover plate 400 and the cutting of the exposed portion of the housing strip 300 and the substrate 100 can be processed such that a cutting surface of the cover plate 400 can be located on a plane identical to those of the exposed portion of the housing strip 300 and a cutting surface of the substrate 100, although not shown either.

Figure 12:
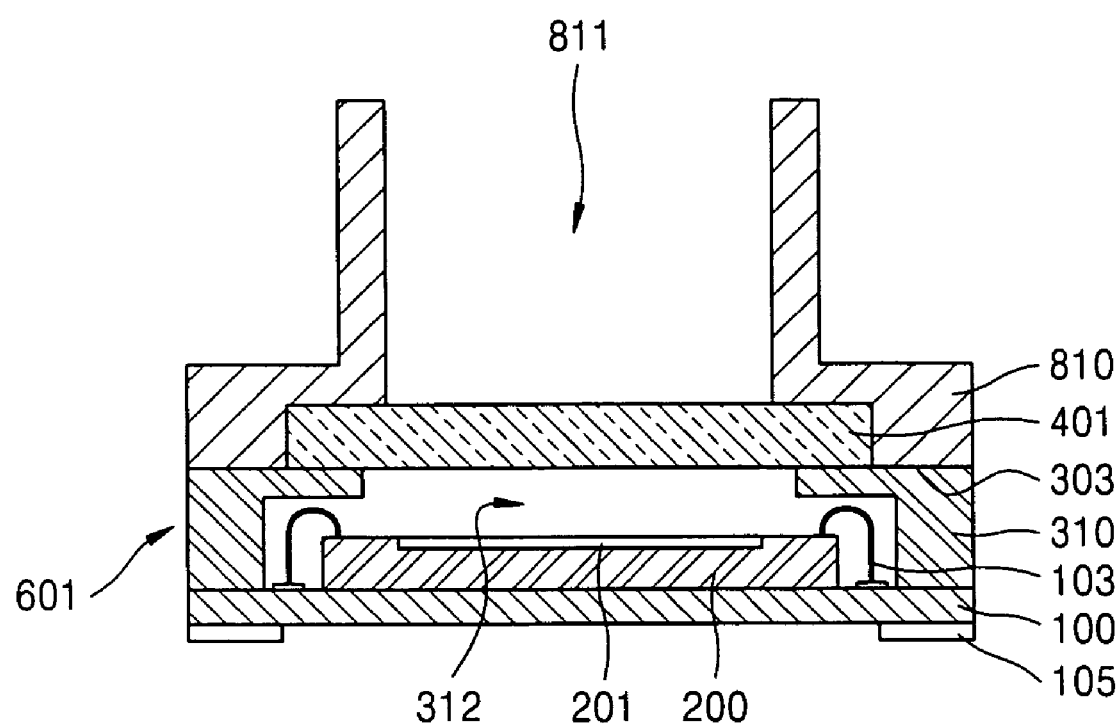
FIG. 12 is a sectional view illustrating a barrel-equipped image sensor package, in accordance with one embodiment of the invention.

FIG. 12 shows an image sensor package with a barrel according to an embodiment of the invention.

The image sensor packages 601 each having the barrel 810 are separated from each other as illustrated with reference to FIG. 11. The lens assembly 700 is assembled on the separated image sensor package 601 by a process illustrated above with reference to FIG. 7A, thereby completing the image sensor package depicted in FIG. 7B.

When the barrel strip 800 is used as described above, since the plurality of image sensor packages each having the barrel 810 are simultaneously assembled, the productivity can be improved and the tolerances between the image sensor packages can be remarkably improved.

FIGS. 13 through 16 show a process for assembling separated individual transparent cover plates onto a housing strip assembly according another embodiment of the present invention.

Figure 13:
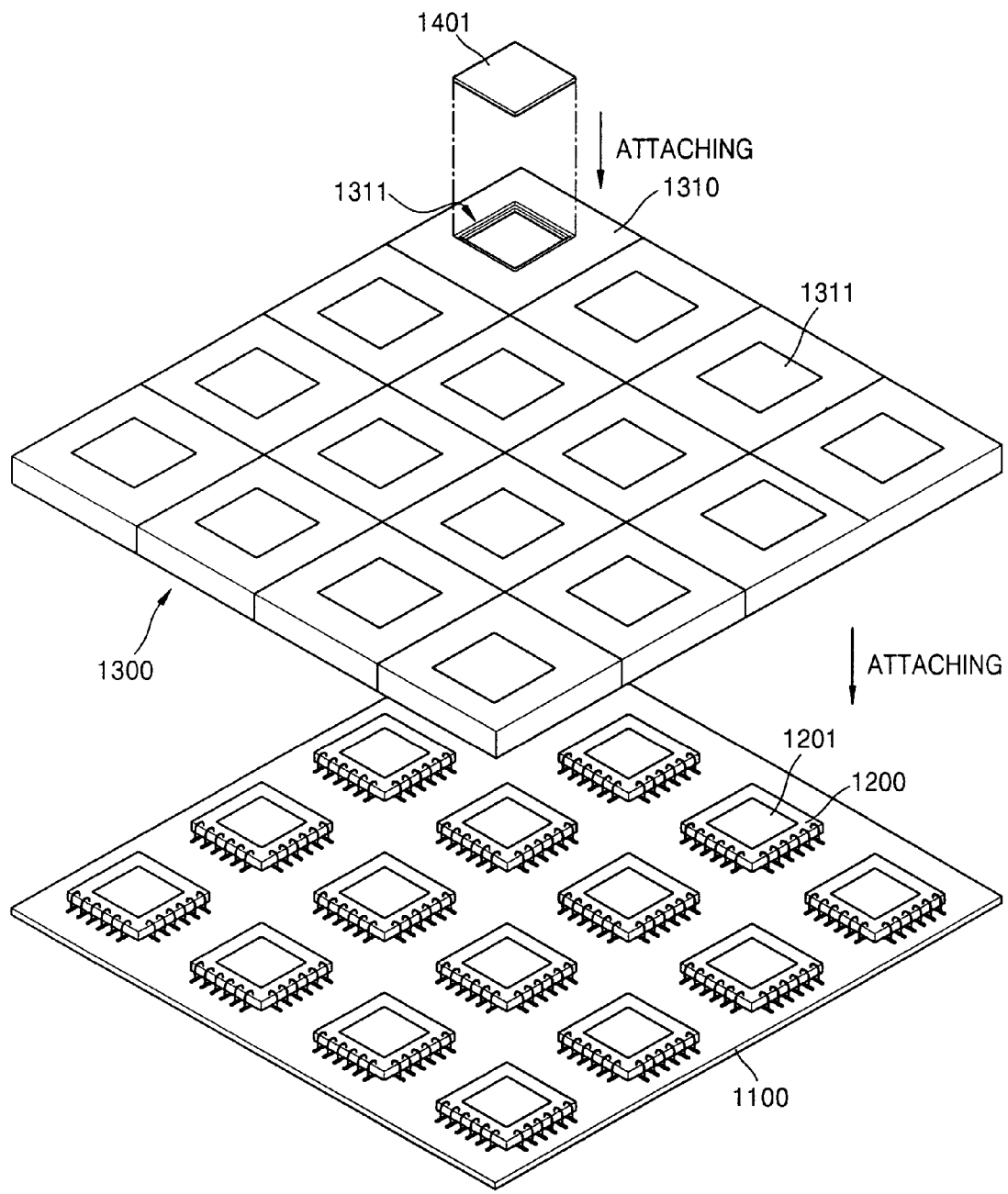
FIGS. 13 through 16 illustrate a process for assembling separated individual transparent cover plates onto a housing strip assembly according to another embodiment of the present invention.

Referring to FIG. 13, as described with reference to FIGS. 1A and 1B, a plurality of image sensors 1200 are affixed and arrayed on a substrate 1100 such that active surfaces of the image sensors 1200 face upward. In addition, as described with reference to FIGS. 2A and 2B, a plurality of housings 1310 each having an aperture 1311 are connected to each other to define a housing strip assembly 1300.

The housing strip assembly 1300 is, as described with reference to FIGS. 4A and 4B, affixed on the substrate 1100. As is described with reference to FIGS. 4A and 4B, a plurality of separated individual transparent cover plates 1401 are arrayed and affixed within the respective apertures 1311, as shown in FIG. 14.

Figure 14:
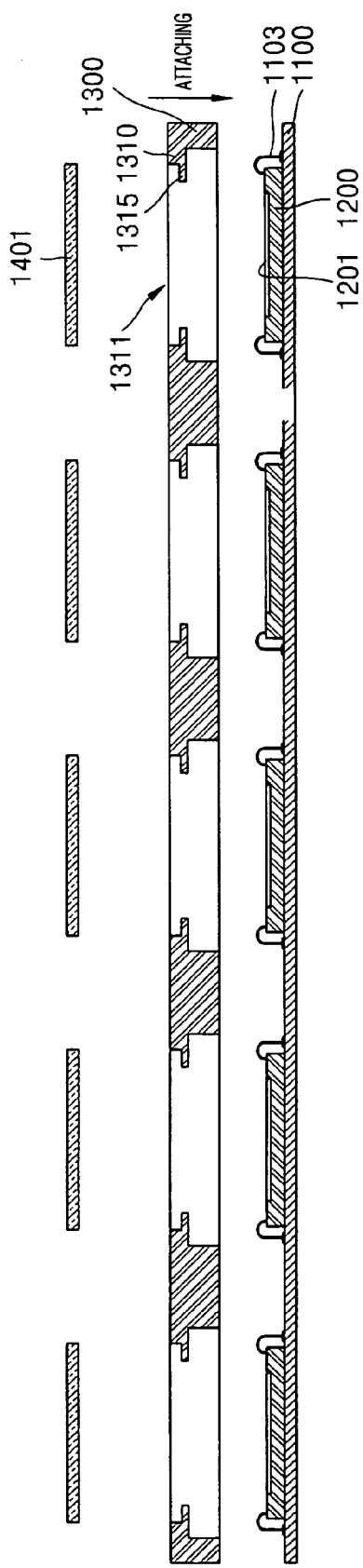

As shown in FIG. 14, a supporting projection 1315 on which the corresponding transparent cover plate 1401 may be formed on an inner circumference of each of the apertures 1311.

Figure 15:
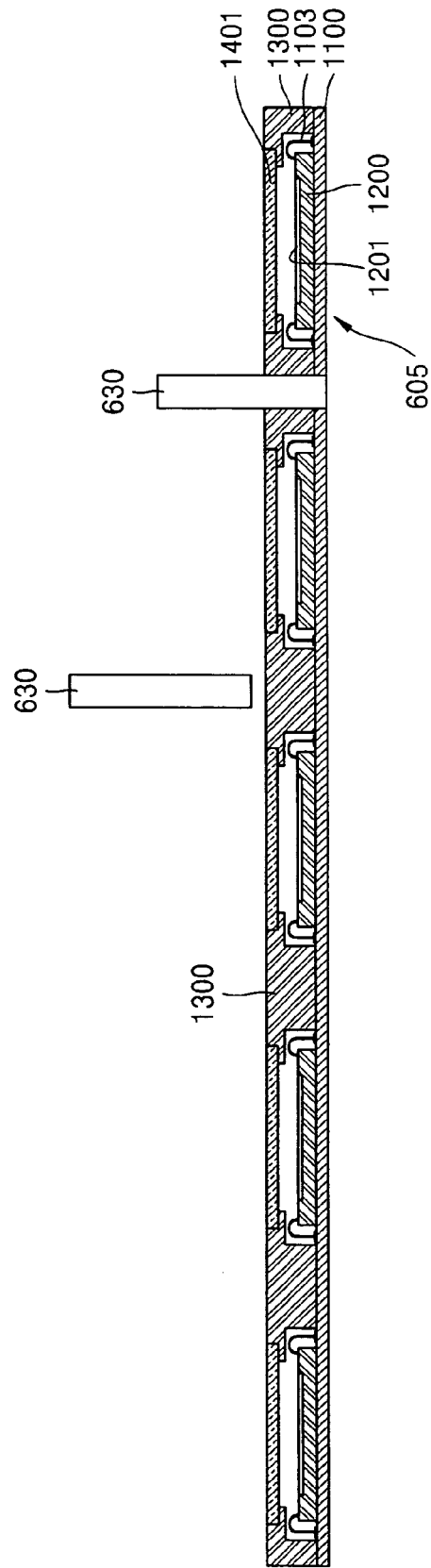

Referring to FIG. 15, as described with reference to FIG. 5B, the housings 1310 on which the respective transparent cover plates 1401 are assembled are separated by a third blade 630, thereby completing a plurality of individual image sensor packages 605.

Figure 16:
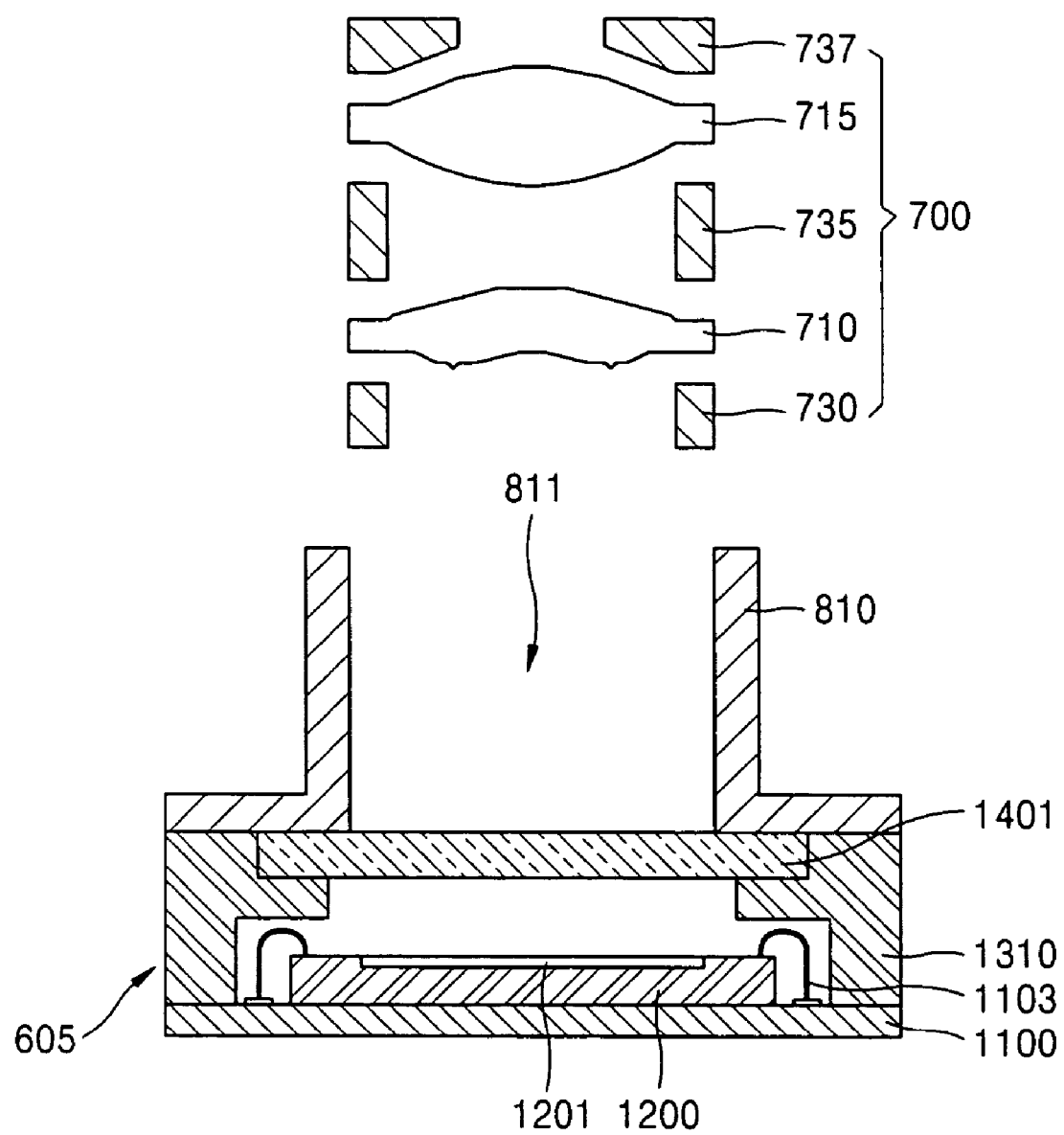

Referring to FIG. 16, as described with reference to FIGS. 7A and 7B, a barrel 810 is assembled on each image sensor package 605 and a lens assembly 700 is assembled in an aperture 811 of the barrel 810. As a result, the image sensor package 605 having the lens assembly 700 can be formed.

According to an aspect of the present invention, the image sensor package such as an air cavity type ceramic leaded chip carrier can be miniaturized and the yield can be improved.

In a typical CCD, since the ceramic package has a step, there is a limitation in reducing the size and costs thereof. Furthermore, since the ceramic package should be handled by the piece, the process is complicated. In addition, particles may be produced at the barrel portion, thereby compromising image quality, and the lens focus must be adjusted by an additional process step. The present invention solves these problems that characterize the prior art devices.

According to another aspect of the present invention, since the lens assembly is assembled in the barrel by a smooth, frictionless sliding motion, the production of free particles or other contaminants can be prevented.

In addition, since the lens components are simply inserted in the barrel with the spacers set by a given back focal length fixed with reference to the window that is the IR filter, the particles that may be formed by screwing or other force-fit friction are not generated and the additional focus adjusting process can be omitted.

Since the cover plate having the plurality of IR filter windows is assembled on the housing strip, the processing efficiency can be improved as compared with a case where the IR filter window is assembled on the housing by the piece.

A series of processes for forming the image sensor packages are performed by multi-strip components. In other words, the individual image sensor packages are separated from each other by a sawing or cutting or scoring-and-snapping or routing individuation process after the components are assembled to each other. Accordingly, it becomes possible to realize a mass production manufacture of the image sensor packages.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An image sensor package assembling method comprising:
   providing a substrate on which a plurality of image sensors are mounted;
   providing a housing strip including a plurality of housings arranged corresponding to an arrangement of the plurality of image sensors on the substrate, each of the plurality of housings including an aperture corresponding to an active surface of a corresponding one of the plurality of image sensors and a cavity for at least partly receiving therein a corresponding one of the plurality of image sensors;
   affixing the housing strip on the substrate;
   attaching a transparent cover plate to seal the apertures of the plurality of housings on the housing strip; and
   separating the plurality of image sensors from each other by cutting the transparent cover plate, the housing strip, and the substrate,
   wherein the separating of the plurality of the image sensors comprises:
      cutting the transparent cover plate, thereby exposing a portion of the housing strip; and
      cutting the substrate and the exposed portion of the housing strip,
      wherein the cutting of the transparent cover plate and the cutting of the exposed portion of the housing strip and the substrate are processed such that a cutting surface of the transparent cover plate can be located more inwardly than the exposed portion of the housing strip and a cutting surface of the substrate.

2. The image sensor package assembling method of claim 1 which further comprises:
   forming an integrated circuit chip between the substrate and each of the image sensors.

3. The image sensor package assembling method of claim 1, wherein the housing strip is formed by an injection molding process.

4. The image sensor package assembling method of claim 1, wherein the housing strip is affixed by an adhesive on intermediate expanses of the substrate defined between the image sensors.

5. The image sensor package assembling method of claim 1, wherein the attaching the transparent cover plate comprises:
   depositing a gel-type adhesive on a contacting surface between the substrate and the transparent cover plate; and
   hardening the gel-type adhesive by thermally pressing the substrate and the transparent cover plate against the housing strip.

6. The image sensor package assembling method of claim 5, further comprising performing a vacuum pumping process during the hardening of the gel-type adhesive.

7. The image sensor package assembling method of claim 1, wherein the cutting of the exposed portion of the housing strip comprises cutting a middle portion of the intermediate expanses between the plurality of housings of the housing strip using a blade.

8. The image sensor package assembling method of claim 1, wherein the cutting of the transparent cover plate and the cutting of the exposed portion of the housing strip and the substrate are processed such that a cutting surface of the transparent cover plate can be located on a plane identical to those of the exposed portion of the housing strip and a cutting surface of the substrate.

9. The image sensor package assembling method of claim 1, wherein the cutting of the transparent cover plate is processed such that a separated transparent cover plate is sized to cover the aperture.

10. An image sensor package assembling method comprising:
    providing a substrate on which a plurality of image sensors are mounted;
    providing a housing strip including a plurality of housings each including an aperture corresponding to an active surface of a corresponding image sensor;
    attaching the housing strip and a transparent cover plate on the substrate;
    separating image sensors from each other by successively cutting the transparent cover plate, the housing strip, and the substrate;
    assembling a barrel on a separated image sensor and attaching the barrel to a top surface of the transparent cover plate and to the housing.

11. An image sensor package assembling method comprising:
    providing a substrate on which a plurality of image sensors are mounted;
    attaching to the substrate a housing strip including a plurality of housings arranged corresponding to an arrangement of the plurality of image sensors on the substrate, each of the plurality of housings including an aperture corresponding to an active surface of a corresponding one of the plurality of image sensors and a cavity for at least partly receiving therein the corresponding one of the plurality of image sensors;
    attaching a transparent cover plate to seal the apertures of the plurality of housings on the housing strip;
    separating image sensors from each other by successively cutting the attached transparent cover plate, the housing strip, and the substrate;
    assembling a barrel on the separated image sensor, the barrel having a barrel aperture corresponding to the aperture of the housing;
    inserting a lens assembly into the barrel; and
    sealing an inlet region of the barrel to capture the lens assembly within the barrel,
    wherein the separating the image sensors comprises:
       cutting a first portion of the transparent cover plate using a first blade to separate the transparent cover plate into a plurality of windows each of which seals one of the corresponding apertures of the respective housings and to expose a first portion of the housing strip; and
       cutting the exposed first portion of the housing strip and the substrate thereunder using a second blade having a narrower effective cutting width than that of the first blade.

12. The image sensor package assembling method of claim 11, wherein the attaching the transparent cover plate comprises:
    depositing a gel-type adhesive on a contacting surface between the substrate and the transparent cover plate; and
    hardening the gel-type adhesive by thermally pressing the substrate and the transparent cover plate against the housing strip.

13. The image sensor package assembling method of claim 12, further comprising performing a vacuum pumping process during the hardening the gel-type adhesive.

14. The image sensor package assembling method of claim 11, wherein the barrel is formed in a cylindrical shape that has a smooth inner right circular cylindrical surface and is vertically oriented relative to a horizontal surface of the transparent cover plate.

15. An image sensor package assembling method comprising:
providing a substrate on which a plurality of image sensors are mounted;
attaching to the substrate a housing strip including a plurality of housings arranged corresponding to an arrangement of the plurality of image sensors on the substrate, each of the plurality of housings including an aperture corresponding to an active surface of a corresponding one of the plurality of image sensors and a cavity for at least partly receiving therein the corresponding one of the plurality of image sensors;
attaching a transparent cover plate to seal the apertures of the plurality of housings on the housing strip;
separating image sensors from each other by successively cutting the attached transparent cover plate, the housing strip, and the substrate;
assembling a barrel on the separated image sensor, the barrel having a barrel aperture corresponding to the aperture of the housing;
inserting a lens assembly into the barrel; and
sealing an inlet region of the barrel to capture the lens assembly within the barrel,
wherein the inserting the lens assembly comprises:
providing a lens to be inserted into the barrel;
aligning a spacer between the lens and the transparent cover plate;
aligning an iris on the lens;
inserting the lens, the spacer and the iris in the barrel; and
bonding the iris to an upper rim surface of the barrel using a first adhesive.

16. The image sensor package assembling method of claim 15, further comprising affixing the spacer, the lens, and the iris to each other using a second adhesive.

17. The image sensor package assembling method of claim 15, wherein the inserting the lens assembly further comprises:
aligning a second spacer on the lens; and
aligning a second lens on the second spacer.

18. An image sensor package assembling method comprising:
providing a substrate on which a plurality of image sensors are mounted;
providing a housing strip having a plurality of housings each having an aperture corresponding to an active surface of a corresponding image sensor;
attaching the housing strip and a transparent cover plate on the substrate;
separating image sensors from each other by successively cutting the attached transparent cover plate, the housing strip, and the substrate;
assembling a barrel on the separated image sensor, the barrel having an aperture corresponding to the aperture of a corresponding one of the plurality of housings, such that the cover plate for the separated image sensor contacts a portion of the top surface of the housing of the separated image sensor, and the barrel contacts a different portion of the top surface of the housing; and
inserting and affixing a lens assembly within the aperture of the barrel.

19. An image sensor package assembling method comprising:
providing an assembly comprising a substrate, an image sensor mounted on the substrate, a housing including an aperture corresponding to an active surface of the image sensor, and a window to seal the aperture of the housing;
mounting a barrel on the assembly, the barrel having a barrel aperture aligned with the aperture of the housing;
inserting a lens assembly into the barrel aperture; and
sealing an inlet of the barrel to fixedly capture the lens assembly,
wherein the inserting the lens assembly comprises:
providing a lens to be inserted into the barrel;
aligning a spacer between the lens and a transparent cover plate;
aligning an iris on the lens;
sliding the lens, the spacer and the iris in the barrel; and
bonding the iris on an upper rim of the barrel using a first adhesive.

20. The image sensor package assembling method of claim 19, wherein the providing the assembly comprises:
forming the window so that the window exposes a top surface of the housing; and
bonding a bottom surface of the barrel on the exposed top surface of the housing an adhesive.

21. The image sensor package assembling method of claim 19, wherein the barrel is formed in a right circular cylindrical shape that is vertically aligned relative to a horizontal surface of the window, the barrel having a smooth inner surface.

22. The image sensor package assembling method of claim 19, further comprising attaching the spacer, the lens and the iris to each other using a second adhesive.

23. The image sensor package assembling method of claim 19, wherein the inserting the lens assembly further comprises:
aligning a second spacer on the lens; and
aligning a second lens on the second spacer.

24. A method comprising:
providing a substrate on which a plurality of image sensors are mounted;
providing a housing strip including a plurality of housings arranged corresponding to an arrangement of the plurality of image sensors on the substrate, each of the plurality of housings including an opening for at least partly receiving therein a corresponding one of the plurality of image sensors;
affixing the housing strip on the substrate;
attaching a cover plate to seal the openings of the plurality of housings on the housing strip; and
separating the plurality of image sensors from each other by cutting the cover plate, the housing strip, and the substrate,
wherein the separating of the plurality of the image sensors comprises:
cutting the cover plate, thereby exposing a portion of the housing strip; and
cutting the substrate and the exposed portion of the housing strip,
wherein the cutting of the transparent cover plate and the cutting of the exposed portion of the housing strip and the substrate are processed such that a width of the cut transparent cover plate is less than a width between the outer edges of the exposed portion of the housing strip.

* * * * *